(12) United States Patent
Miyata et al.

(10) Patent No.: US 7,438,783 B2
(45) Date of Patent: Oct. 21, 2008

(54) PLASMA PROCESSING APPARATUS AND PLASMA PROCESSING METHOD

(75) Inventors: Koji Miyata, Fukui (JP); Tetsuji Sato, Yamanashi (JP)

(73) Assignees: Shin-Etsu Chemical Co., Ltd., Tokyo (JP); Tokyo Electron Limited, Tokyo (JP)

(*) Notice: Subject to any disclaimer, the term of this patent is extended or adjusted under 35 U.S.C. 154(b) by 205 days.

(21) Appl. No.: 11/116,442

(22) Filed: Apr. 28, 2005

(65) Prior Publication Data

US 2006/0081559 A1     Apr. 20, 2006

(30) Foreign Application Priority Data

Oct. 15, 2004     (JP)     ............... 2004-301781

(51) Int. Cl.
*H01L 21/00*     (2006.01)
*C23C 16/00*     (2006.01)

(52) U.S. Cl. ............... 156/345.46; 118/723 E
(58) Field of Classification Search ............. 118/723 E; 156/345.46
See application file for complete search history.

(56) References Cited

U.S. PATENT DOCUMENTS

| | | | | |
|---|---|---|---|---|
| 5,429,070 A | * | 7/1995 | Campbell et al. | 118/723 R |
| 5,444,207 A | * | 8/1995 | Sekine et al. | 219/121.43 |
| 6,014,943 A | * | 1/2000 | Arami et al. | 118/723 E |
| 6,514,377 B1 | * | 2/2003 | Morimoto | 156/345.46 |
| 2004/0238125 A1 | * | 12/2004 | Ono et al. | 156/345.46 |
| 2005/0039854 A1 | * | 2/2005 | Matsuyama et al. | 156/345.44 |
| 2005/0211383 A1 | * | 9/2005 | Miyata et al. | 156/345.46 |

FOREIGN PATENT DOCUMENTS

| | | | |
|---|---|---|---|
| JP | 04280430 A | * | 10/1992 |
| JP | 06181187 A | * | 6/1994 |
| JP | 2000-306845 A | | 11/2000 |

* cited by examiner

*Primary Examiner*—Parviz Hassanzadeh
*Assistant Examiner*—Michelle Crowell
(74) *Attorney, Agent, or Firm*—Sughrue Mion, PLLC

(57) ABSTRACT

Disclosed is a plasma processing apparatus and a plasma processing method. A substrate to be processed is accommodated in a vacuum chamber within which a plasma generator is provided so as to generate plasma for use in performing plasma processing on the substrate. Outside the vacuum chamber provided is a magnetic field generator for generating a multi-pole magnetic field at the periphery of the substrate. The magnetic field generator comprises an inner ring-shaped magnetic field generating portion and an outer ring-shaped magnetic field generating portion, both of which are provided outside the vacuum chamber in a concentric relationship with the vacuum chamber and are independently rotatable with each other.

6 Claims, 11 Drawing Sheets

CROSS SECTION TAKEN ALONG LINE B-B

CROSS SECTION TAKEN ALONG LINE C-C

PLASMA PROCESSING APPARATUS AND PLASMA PROCESSING METHOD

BACKGROUND OF THE INVENTION

1. Field of the Invention

The present invention relates generally to an apparatus and method for implementing plasma processing on a work piece substrate such as a semiconductor wafer or the like.

2. Description of Related Art

In the field of manufacturing semiconductor devices, a semiconductor treatment apparatus is known for generating magnetron plasma in a vacuum chamber (viz., process chamber). The plasma thus generated is allowed to act on a work piece such as a semiconductor wafer positioned within the vacuum chamber whereby a desired treatment process such as etching and film forming, etc. is performed.

In order to attain satisfactory results, it is necessary to maintain the plasma in a state optimized for a particular process. For this purpose, the magnetron plasma processing apparatus is provided with a magnetic field generator which controls or confines plasma in a desired state.

In order to effectively control or confine plasma, it is known in the art to utilize a multi-pole type magnetic field generator which, by way of example, is disclosed in Japanese Patent Publication No. 2000-306845. In such a type of generator, a plurality of magnets is circularly arranged outside a work piece substrate (e.g. a semiconductor wafer) in a manner that their north and south poles alternate with each other. The wafer is positioned horizontally within the vacuum chamber with the main surface facing upward. With this arrangement, a multi-pole magnetic field is generated at the periphery of a semiconductor wafer placed in the chamber, while no magnetic field is generated above the semiconductor wafer. The number of magnetic poles is equal to four or more than that, and usually selected from a range between eight and forty depending on the required field strength at the periphery of the wafer.

As mentioned above, it is known in the art to utilize a plasma treatment apparatus wherein etching proceeds on a semiconductor wafer using multi-pole magnetic field generated at the periphery of the wafer and maintaining the state of the plasma by appropriately controlling the strength of the multi-pole magnetic field. However, according to the research of the inventors of the instant application it was discovered that there are two contradictory instances in terms of etch rate uniformity across the wafer's surface. In one instance the etch rate uniformity is increased in the presence of multi-pole magnetic field, while in the other instance the etch rate uniformity is increased in the absence of multi-pole magnetic field.

When etching is performed on a silicon dioxide film, the etch rate uniformity is more improved in the presence of a multi-pole magnetic field. In this case, the absence of multi-pole magnetic field causes the etch rate to go high at the wafer's center area and low at the wafer's peripheral area.

On the contrary, when etching is performed on an organic low-dielectric (low-K) film and the like, the etch rate uniformity on the wafer's surface was more improved in the absence of multi-pole magnetic field. In such an instance, the presence of a multi-pole magnetic field causes the etch rate to go low at the wafer's center area and high at the wafer's peripheral region.

If electromagnets are used to generate a multi-pole magnetic field, the start/stop control of the magnetic field generation can be carried out with ease. However, the use of electromagnets is disadvantageous due to their high power consumption and bulkiness. For these reasons, the current practice is to employ permanent magnets. However, A large loading machine is required to mount and dismount permanent magnets on and from the processing apparatus to perform the start/stop control, and accordingly, this involves a long time to operate the machine, resulting in a lowering of the overall working efficiency of semiconductor processing.

SUMMARY OF THE INVENTION

It is therefore an object of the present invention to provide a plasma processing apparatus which is able to adaptively set or control the state of a multiple magnetic field in accordance with a variety of plasma processing operations thereby to make it possible to ease the semiconductor wafer treatment with a simple mechanism.

Another object of the present invention is to provide a method of processing a work piece substrate in order to adaptively set or control the state of a multiple magnetic field depending on a variety of plasma processing operations, whereby the substrate is able to be easily treated with a simple mechanism.

One aspect of the present invention resides in a plasma processing apparatus, comprising: a vacuum chamber for accommodating a substrate therein; a plasma generator, provided within the vacuum chamber, for generating plasma for use in performing plasma processing on the substrate; and a magnetic field generator, provided outside the vacuum chamber, for generating a multi-pole magnetic field at the periphery of the substrate, wherein the magnetic field generator comprises an inner ring-shaped magnetic field generating portion and an outer ring-shaped magnetic field generating portion, both of which are provided outside the vacuum chamber in a concentric relationship with the vacuum chamber and are independently rotatable with each other.

Another aspect of the present invention resides in the above-mentioned plasma processing apparatus, wherein the inner ring-shaped magnetic field generating portion comprises a plurality of segment magnets each of which is circumferentially magnetized with respect to the center of the vacuum chamber, and wherein the outer ring-shaped magnetic field generating portion comprises a plurality of segment magnets each of which is radially magnetized with respect to the center of the vacuum chamber.

Still another aspect of the present invention resides in the above-mentioned plasma processing apparatus, wherein each of the inner and outer magnetic field generating portions comprises upper and lower magnetic field generating portions which are vertically provided with spacing therebetween.

Still another aspect of the present invention resides in the above-mentioned plasma processing apparatus, wherein each of the inner and outer magnetic field generating portions comprises an upper and lower magnetic field generating portions which are vertically provided with spacing therebetween, and wherein each of the upper and lower magnetic field generating portions comprises a plurality of magnetic segments each being magnetized in a direction in parallel with a center axis of the magnetic field generator, and wherein the magnetic segments of each of the upper and lower magnetic field generating portions faces vertically with same magnetic pole.

Still another aspect of the present invention resides in the above-mentioned plasma processing apparatus, wherein a relative position of the inner and outer magnetic field generating portions is controlled so as to generate the multi-pole magnetic field at the periphery of the substrate, or so as to generate non multi-pole magnetic field at the periphery of the substrate.

One aspect of the present invention resides in a method of implementing plasma processing on a substrate accommodated in a vacuum chamber, plasma being generated within the vacuum chamber and confined using a multi-pole magnetic field generated within the vacuum chamber, the method comprising a step of controlling the multi-pole magnetic field by independently rotating an inner and outer ring-shaped magnetic field generating means which are provided in a concentric relationship with the vacuum chamber,

BRIEF DESCRIPTION OF THE DRAWINGS

The features and advantages of the present invention will become more clearly appreciated from the following description taken in conjunction with the accompanying drawings in which like elements or portions are denoted by like reference numerals and in which.

DETAILED DESCRIPTION OF THE PREFERRED EMBODIMENTS

The present invention will be described with reference to the accompanying drawings.

Figure 1:
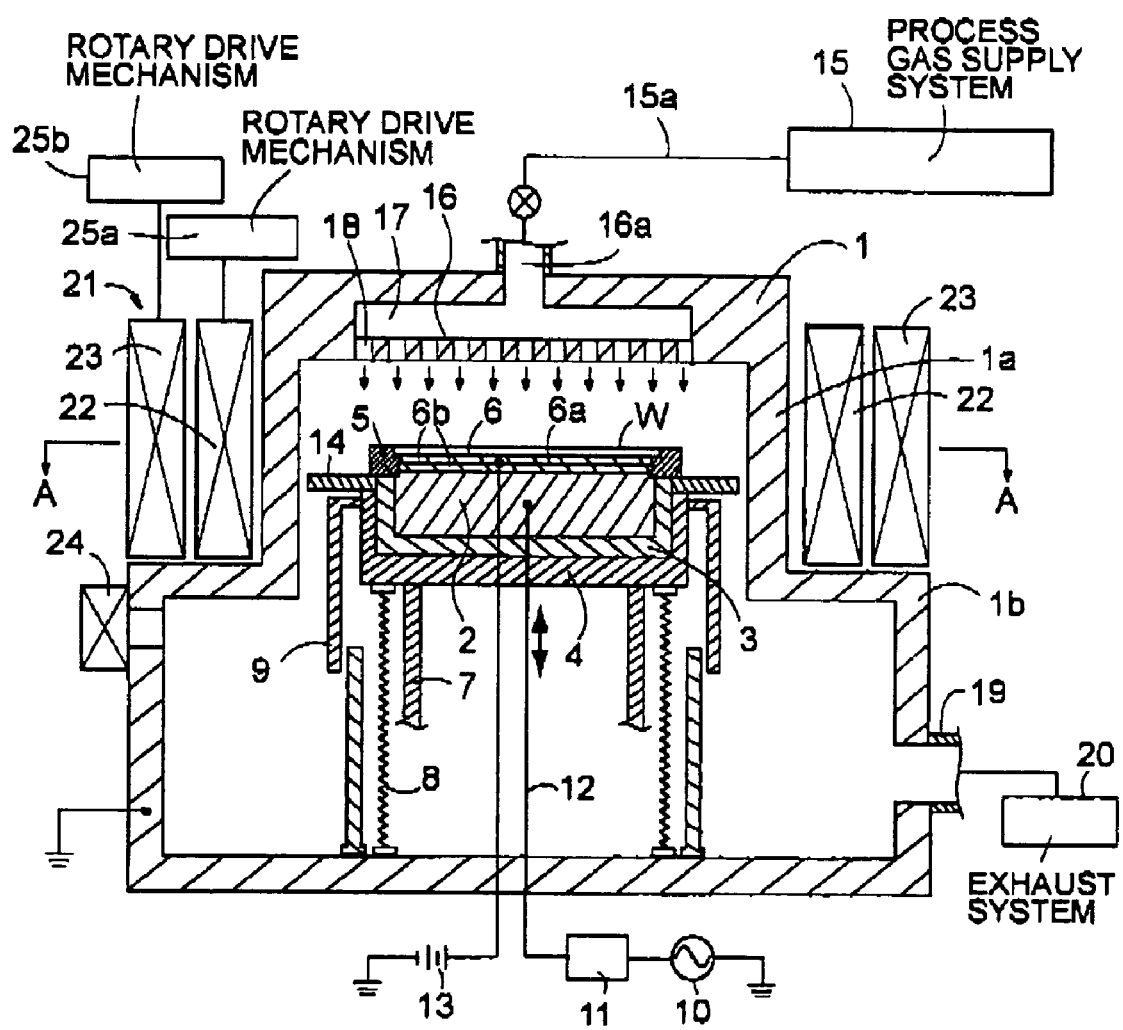
FIG. 1 is a diagram for schematically illustrating a plasma processing apparatus to which the present invention is applicable.

FIG. 1 schematically illustrates a magnetic field generator for magnetron plasma generation in accordance with the present invention, which generator is applied to a plasma etching apparatus for performing etch onto a semiconductor wafer. In FIG. 1, a vacuum chamber (viz., process chamber) 1, which is made of aluminum (for example), serves to function as a plasma treatment space. The vacuum chamber 1 is substantially a cylindrical shape appearance, and is comprised of an upper portion 1a and a lower portion 1b with a stepwise portion therebetween. The vacuum chamber 1 is electrically grounded, and the upper portion 1a is configured such as to be smaller in terms of diameter relative to the lower portion 1b. Within the vacuum chamber 1 is a support table (susceptor) 2 that holds a semiconductor wafer W with its principle surface facing upwards.

The support table 2, typically formed of aluminum, is positioned on a support base 4 electrically isolated by an insulator 3 such as ceramic. Further, a focus ring 5 formed either of conductive or non-conductive material, is secured to the upper circumference of the support table 2.

An electrostatic chuck 6 is provided on the surface of the support table 2 to hold the wafer W in a fixed position by electrostatic attraction. The chuck 6 includes an electrode 6a between insulators 6b, the electrode 6a being coupled to a direct current power source 13. When the electrode 6a is impressed with a dc voltage, the semiconductor wafer W is attracted to the support table 2 under Coulomb's force and held in position.

The support table 2 is provided with a refrigerant conduit (not shown) for circulating refrigerant, and further provided with a gas supplier (also not shown) for introducing helium gas to the wafer's lower surface as an effective thermal transfer means between the wafer W and the refrigerant, whereby the semiconductor wafer W is maintained at a desired temperature.

The support table 2 and the support base 4 can be adjusted in elevation by means of a ball screw mechanism a part of which is illustrated by a ball screw 7, and a driving portion at the lower part of the support base 4 is covered with a stainless steel (SUS) bellows 8 the outside of which is surrounded by a bellows cover 9.

A power feed line 12, which is used to supply high frequency electric power, is connected to the center area of the support table 2. To the power feed line 12 is also coupled a high frequency source 10 and a matching box 11. The high frequency power source 10 generates high frequency electric power in the range between 13.56 MHz and 150 MHz (preferably between 13.56 MHz and 100 MHz). By way of example, 100 MHz electric power is supplied to the support table 2.

Further, in order to increase an etch rate, it is preferable to superimpose two high frequencies one of which is for generating plasma and the other is for pulling ions among plasma. It is typical to use a high frequency power source (not shown) for ion pulling (bias voltage control), which frequency range is between 500 kHz and 13.56 MHz. The frequency of 3.2 MHz is preferred for etching silicon dioxide and 13.56 MHz is preferred for etching polysilicon or organic films.

On the outer side of the focus ring 5 is a baffle plate 14, which is electrically connected to the vacuum chamber 1 via the support base 4 and the bellows 8, A shower head 16, which is grounded, is attached to the ceiling over the support table 2 in the vacuum chamber 1, in a manner to be in parallel with and opposite to the support table 2. Therefore, the support table 2 and the shower head 16 are made to operate as a pair of electrodes.

Many gas section holes 18 are provided in the shower head 16, above which a gas inlet port 16a is provided. A gas diffusion space 17 is formed between the shower head 16 and the ceiling of vacuum chamber 1. The gas inlet port 16a communicates via a gas supply duct 15a to a gas supply system 15 that supplies reaction and diluted gases for etching.

As a reaction gas, halogen group (fluoric and chloric groups) gases, and hydrogen gas and the like, for example, can be used. As a diluted gas, argon and helium gases can be used as is typically used in the field of technology in question. In an etching process, the process gas(es) as mentioned above is supplied from the gas supply system 15, via the conduit 15a and the gas inlet port 16a, into the gas diffusion space 17 over the shower head 16, where the gas is ejected through the gas ejection holes 18 and used to implement etching of a film formed on the surface of semiconductor wafer W.

A gas exhaust port 19 is provided at the sidewall of the lower part 1b of vacuum chamber 1, and communicates with a gas exhaust system 20 which is used to maintain the vacuum chamber 1 at a desired negative pressure level by operating a vacuum pomp. Further, the lower part 1b of the vacuum chamber 1 is provided at a higher vertical position of its sidewall with a gate valve 24 for introducing a semiconductor wafer into, and withdrawing it out of, the vacuum chamber 1.

Surrounding the upper part 1a of vacuum chamber 1 is a ring-shaped magnetic field generator 21 which is arranged in a concentric relationship with the vacuum chamber 1 so as to generate a multi-pole magnetic field around a processing space between the support table 2 and the shower head 16.

Figure 2:
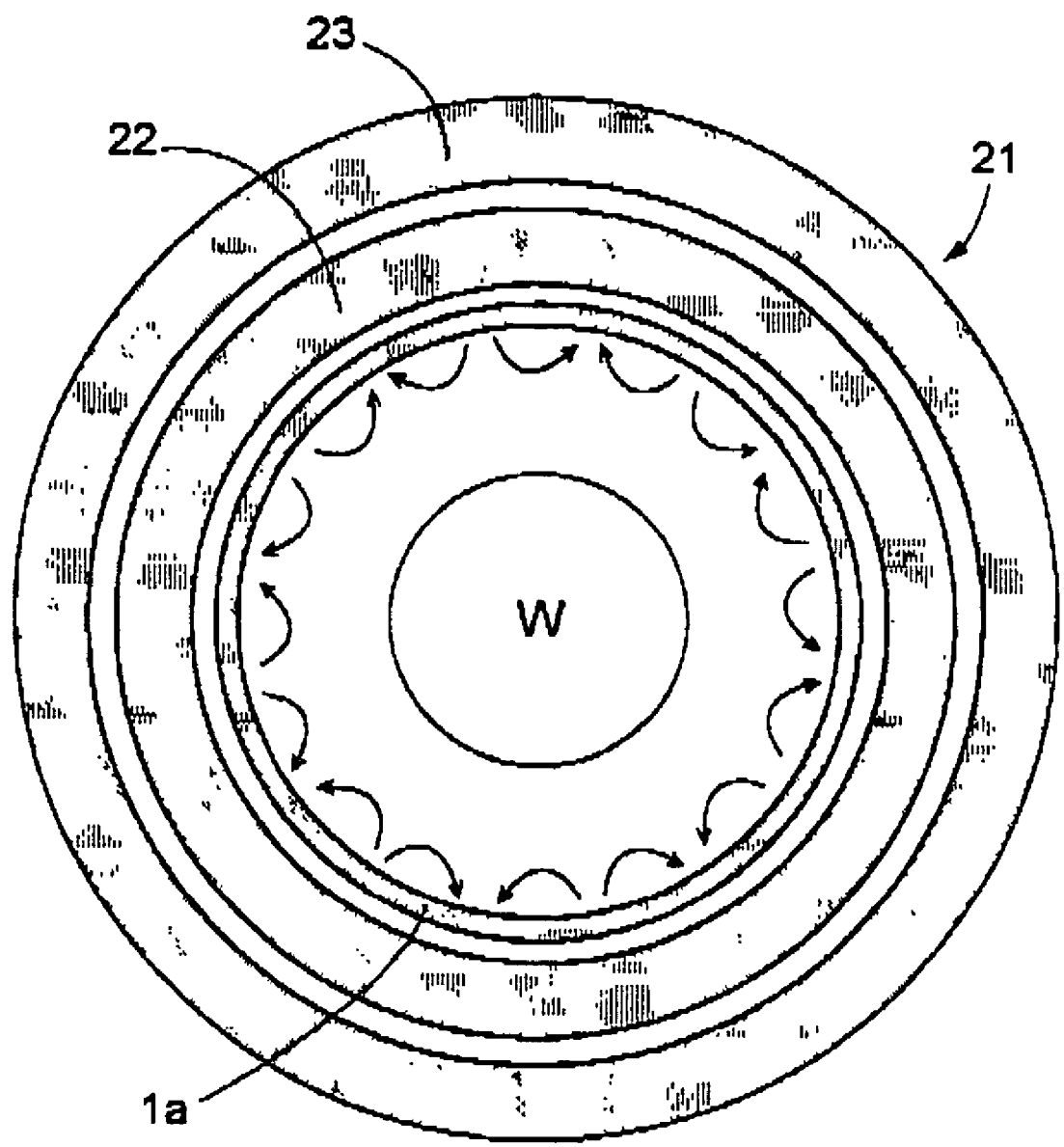
FIG. 2 is a cross-sectional view taken along a section line A-A of FIG. 1.

FIG. 2 is a cross-sectional view taken along a cross section line A-A. In order to simplify the drawing of FIG. 2, the focus ring 5 shown in FIG. 1 is omitted.

As illustrated in FIGS. 1 and 2, the magnetic field generator 21 is comprised of an inner and outer ring-shaped (or ring-like) magnetic field generating portions 22 and 23, which are independently rotatable around the vacuum chamber 1 by way of two rotation mechanisms 25a and 25b, respectively. The magnets per se, which form part of the magnetic field generator 21, are able to be prepared using known ones, and further, the rotation mechanisms 25a and 25b themselves are known to those skilled in the art, and as such, the details thereof are not illustrated in detail in the drawings. The magnetic field generation portions 22 and 23 cause the magnetic lines of force to be generated in the vacuum chamber 1, as exemplified in FIG. 2. In this case, a multi-pole magnetic field of intensity of 0.01 to 0.2 T (100 to 2000 G), preferably, 0.03 to 0.045 T (300 to 450 G) is produced in the vicinity of the inner sidewall of the vacuum chamber 1. In the center area of the wafer W the magnetic field intensity is reduced to a substantially zero value.

The intensity of the multi-pole magnetic field is regulated within a specified range to prevent flux leakage due to high magnetic field intensity, while preventing failure from confining plasma due to low magnetic field intensity. Since the required magnetic field intensity varies depending on the structure and the materials that constitute the magnetic field generator, the present invention is not to be limited to the above mentioned numerical values.

While the magnetic field at the center of the wafer W is preferably of zero Tesla value, the presence of some magnetic field is allowed in the area where the wafer is located if the strength of this magnetic field is not strong enough to cause some unfavorable effect on the etching process. In the case shown in FIG. 2, a magnetic field of strength less than 420μT (4.2 G) (by way of example) is formed around the wafer, which is sufficient to confine plasma.

A reference is made to FIG. 3, wherein there is shown a first embodiment of the present invention. According to the instant embodiment, the inner magnetic field generating portion 22 is provide with a plurality of magnetic segments 31 which are respectively magnetized in circumferential directions relative to the center of the vacuum chamber 1. On the other hand, the outer magnetic field generating portion 23 is provide with a plurality of magnetic segments 33 which are respectively magnetized in radial directions relative to the center of the vacuum chamber 1.

Figure 3A:
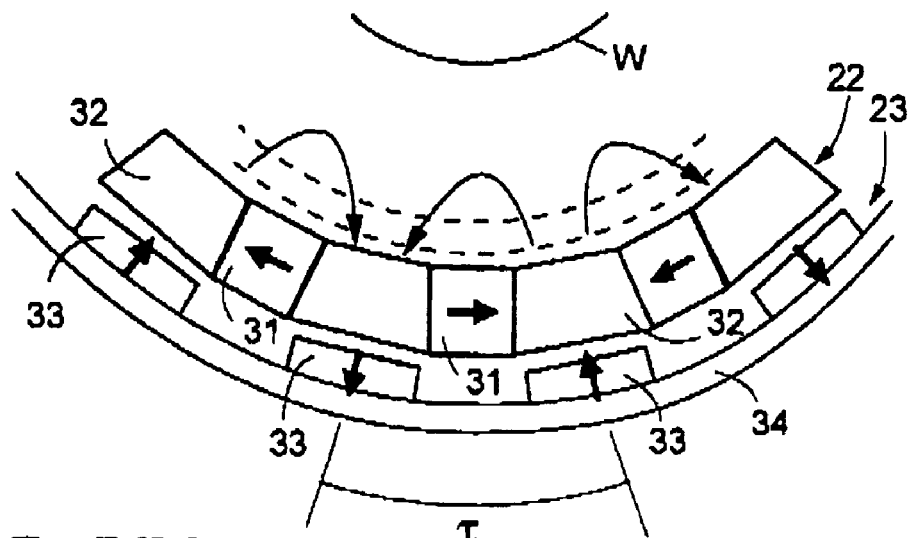
FIGS. 3(a) to 3(c) are diagrams for describing a first embodiment of the present invention.

More specifically, as shown in FIG. 3(a), the magnetic segments 31 of the inner magnetic field generating portion 22 are respectively magnetized in the circumferential directions with the magnetic poles thereof being alternated, and have respectively magnetic material piece (i.e., block) therebetween. On the other hand, the magnetic segments 33 of the outer magnetic field generating portion 23 are respectively magnetized in radial directions with the poles thereof being alternated, and have outer sides thereof secured to a magnetic ring (or cylinder) 34. Although it is not necessarily required to provide the magnetic pieces 32 and the magnetic ring 34, it is preferable to do so in order to increase magnetic field efficiencies. Suitable materials for the magnetic pieces 32 and the magnetic ring 34 are pure iron, carbon steel, iron-cobalt steel, stainless steel and the like.

Figure 3B:
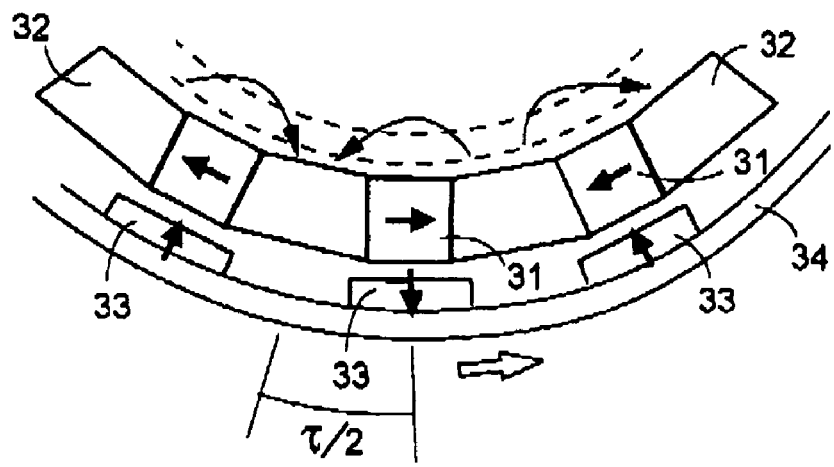

A description will be made as to the change of magnetic field within the vacuum chamber 1 when changing the relative position of the inner and outer magnetic field generating portions 22 and 23 in the circumferential directions. When these portions 22 and 23 are situated as shown in FIG. 3(a) (hereinafter this position is referred to as a reference or standard one), the multi-pole magnetic field in the vacuum chamber 1 exhibits a maximum value. For the sake of convenience of description, the magnetic pole pitch is denoted by x as shown in FIG. 3(a). As shown in FIG. 3(b), when the inner and outer magnetic field generating portions 22 and 23 are displaced with each other by $\tau/2$ from the reference position (FIG. 3(a)), the strength of the multi-pole magnetic field in the vacuum chamber 1 becomes lower relative to the case shown in FIG. 3(a). Further, as shown in FIG. 3(c), when the magnetic field generating portions 22 and 23 are displaced with other in the circumferential direction by $\tau$ from the reference position, the magnetic fluxes in the vacuum chamber 1 becomes substantially zero.

Figure 3C:
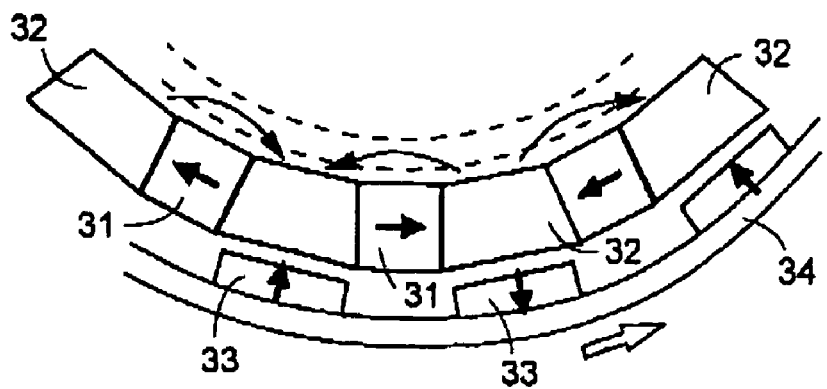

As mentioned above, if the relative position in the circumferential direction of the magnetic field generating portions 22 and 23 is varied from the reference position (FIG. 3(a)) to the magnetic pole pitch $\tau$ (FIG. 3(c)), the strength of the multi-pole magnetic field in the vacuum chamber 1 can be changed or controlled from the maximum value to substantially zero value.

In FIGS. 3(a) to 3(c), only the outer magnetic field generating portion 23 is rotated. However, since the inner and outer magnetic field generating portions 22 and 23 are able to independently be rotated, it is possible to rotate only the inner magnetic field generation portion 22 and as an alternative to rotate both the portions 22 and 23 in reverse circumferential directions with each other.

Figure 4A:
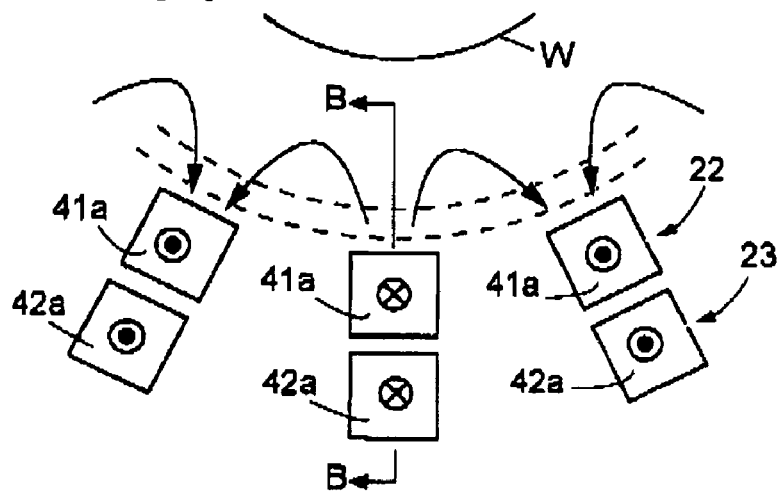
FIGS. 4(a) to 4(c) are diagrams for describing a second embodiment of the present invention.
Figure 4B:
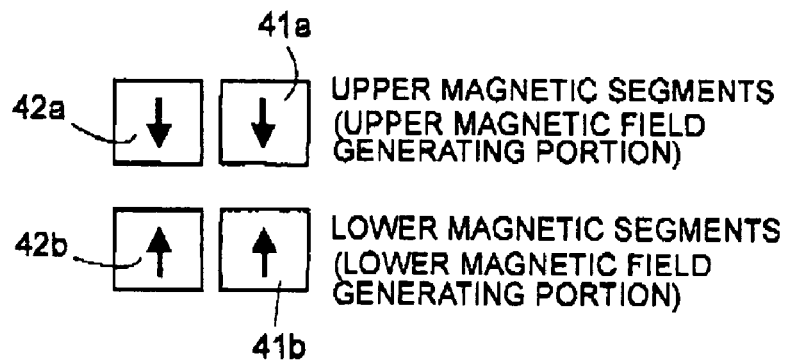
Figure 4C:
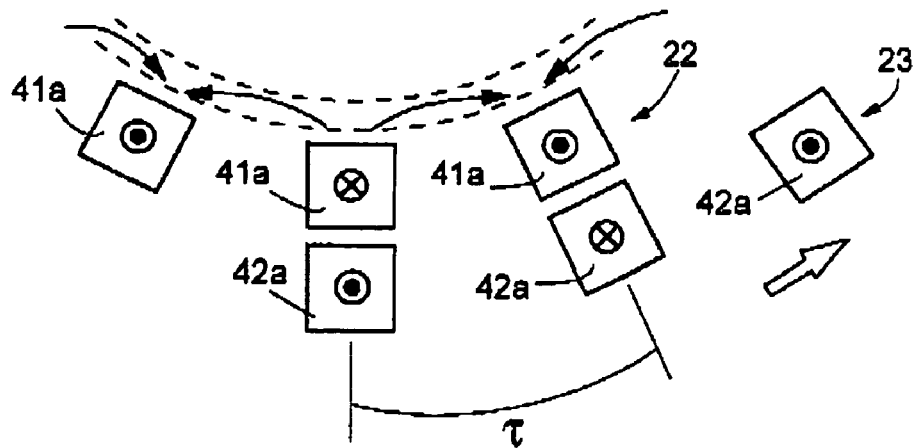

Referring to FIGS. 4(a) to 4(c), there is schematically illustrated a second embodiment of the present invention.

The magnetic field generator of the second embodiment, which corresponds to the magnetic field generator 21 of FIG. 1, is compressed of an inner and outer magnetic field generating portions 22 and 23 as with the first embodiment. However, the second embodiment differs from the first embodiment in that each of the inner and outer magnetic field generating portions 22 and 23 is divided into an upper and lower magnetic field generating portions with spacing therebetween.

As shown in FIG. 4(a), the inner magnetic field generating portion 22 comprises a plurality of upper magnetic segments 41a, and likewise, the outer magnetic field generating portion 23 comprises a plurality of upper magnetic segments 42a. These upper magnetic segments 41a and 42a are respectively provided circumferentialy around the vacuum chamber 1 (see FIG. 1) with a predetermined interval therebetween and with the magnetic poles thereof being alternately reversed. Further, the magnetized directions of the upper magnetic segments 41*a* and 42*a* are respectively oriented in the directions in parallel with the center axis of the magnetic field generating mechanism.

FIG. 4(*b*) is a cross-sectional view taken along the line B-B of FIG. 4(*a*), and illustrates part of upper and lower magnetic field generating portion. More specifically, FIG. 4(*b*) shows, in addition to the upper magnet segments 41*a* and 42*a*, two lower magnetic segments 41*b* and 42*b* which form respectively the inner and outer magnetic field generating portions 22 and 23, and further shows that each of the corresponding upper and lower magnetic segments 41*a*-41*b* and 42*a*-42*b* face with each other with the identical magnetic pole.

A description will be made as to the change of magnetic field within the vacuum chamber 1 when changing the relative position of the inner and outer magnetic field generating portions 22 and 23 in the circumferential directions. When the magnetic field generating portions 22 and 23 are positioned as shown in FIG. 4(*a*), the multi-pole magnetic field in the vacuum chamber 1 becomes maximal. FIG. 4(*c*) indicates that the inner and outer magnetic field generating portions 22 and 23 are displaced with each by the magnetic pole pitch τ compared to the case shown in FIG. 4(*a*). In this instance, almost all of the magnetic fluxes from the inner magnetic segments 41*a* and 41*b* reach respectively the corresponding outer magnetic segments 42*a* and 42*b*, and accordingly, there are almost no magnetic fluxes in the vacuum chamber 1. Therefore, when the magnetic field generating portions 22 and 23 are displaced with other in the circumferential direction by x from the reference position (FIG. 4(*a*)), the magnetic fluxes in the vacuum chamber 1 is capable of being changed from the maximum value to substantially zero.

Figure 5:
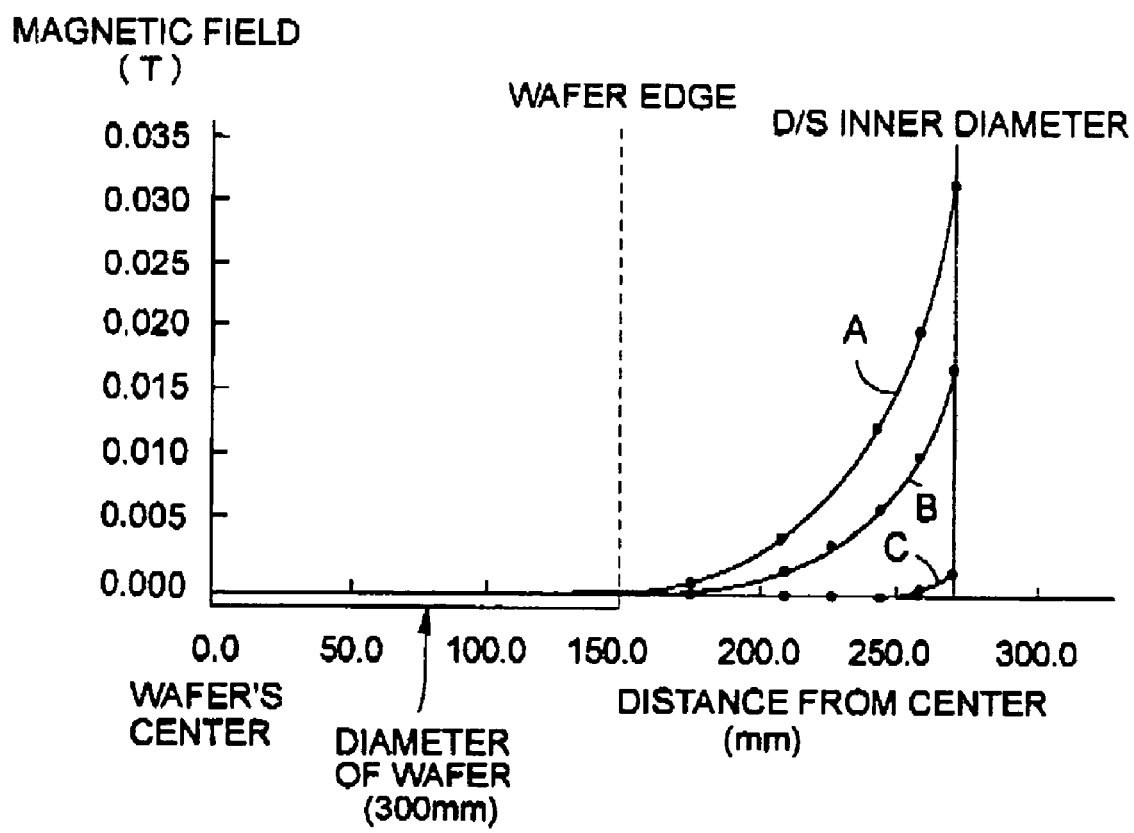
FIG. 5 is a graphic representation for describing the states of the magnetic field strength within a vacuum chamber according to the first embodiment of the present invention.

FIG. 5 is a graphic representation of the magnetic field strength within the vacuum chamber 1 measured as a function of the distance from the center of wafer W when the inner and outer magnetic field generating portions 22 and 23 are situated at the reference position as shown in FIGS. 3(*a*) and 4(*a*) (denoted by curve A), when the inner and outer magnetic field generating portions 22 and 23 are relatively displaced, as shown in FIG. 3(*b*), by τ/2 with respect to the aforesaid reference position as shown in FIG. 3(*b*) (denoted by curve B), and when the inner and outer magnetic field generating portions 22 and 23 are relatively displaced, as shown in FIGS. 3(*c*) and 4(*c*), by the magnetic pole pitch τ with respect to the reference position (denoted by curve C). Note that D/S inner diameter represents the inner diameter of a deposit shield attached to the inner wall of the vacuum chamber 1, and as such the D/S inner diameter is substantially equal to the inner diameter of the vacuum chamber 1.

As indicated by the curve A of FIG. 5, when the inner and outer magnetic field generating portions 22 and 23 are situated at the reference position, the multi-pole magnetic field reaches substantially the circumference of wafer W. On the other hand, as indicated by the curve C, when the inner and outer magnetic field generating portions 22 and 23 are relatively displaced by τ with respect to the reference position, the strength of the multi-pole magnetic field within the vacuum chamber 1 is substantially reduced to zero. Further, as indicated by the curve B, when the inner and outer magnetic field generating portions 22 and 23 are relatively displaced by τ/2 from the reference position, the strength of the multi-pole magnetic field within the vacuum chamber 1 is of an intermediate value of the above mentioned two cases.

As mentioned above, with the first and second embodiments of the present invention, the inner and outer magnetic field generating portions 22 and 23 of the magnetic field generator 21 are arranged such as to rotate independently with each other. By changing the relative position of the inner and outer magnetic field generating portions 22 and 23, the multi-pole magnetic field generation can be controlled in a manner that the field is generated or reduced to substantially zero value around the semiconductor wafer W within the vacuum chamber 1.

Accordingly, when etching is to be performed on a silicon dioxide film or the like, a multi-pole magnetic field is generated around the semiconductor wafer W in the vacuum chamber 1 while performing the etching, whereby the uniformity of the etch rate across the surface of the semiconductor wafer W is able to be improved. On the contrary, when etching is performed on an organic low-dielectric film (Low-K) or the like, a multi-pole magnetic field is not generated around the semiconductor wafer W in the vacuum chamber 1 while performing the etching, whereby the uniformity of the etch rate on the surface of the semiconductor wafer W is able to be improved.

Figure 6:
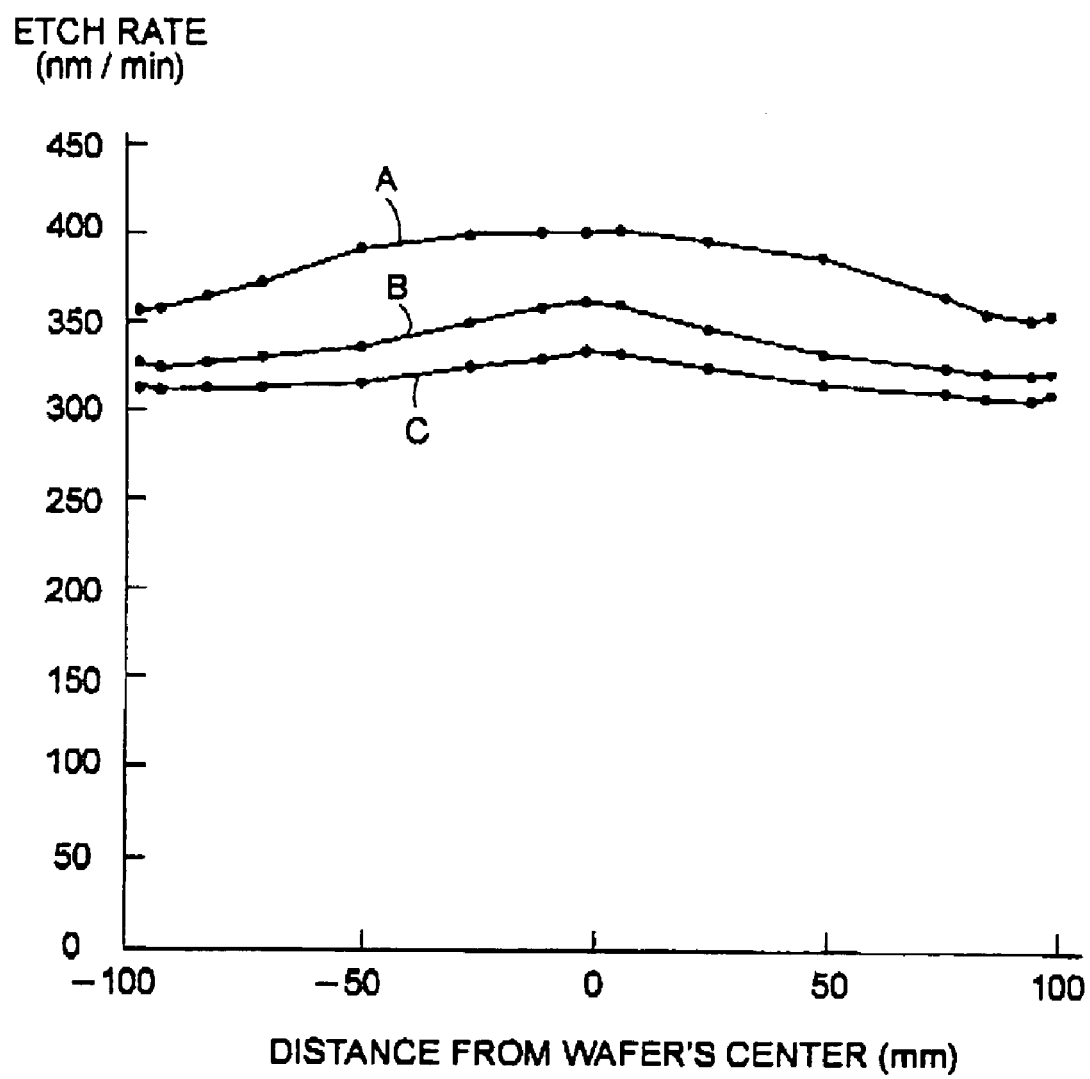
FIG. 6 is a graphic representation for exemplifying etch rate variations across a semiconductor wafer's surface using a certain process gas under different sates of magnetic field, according to the first embodiment of the present invention.
Figure 7:
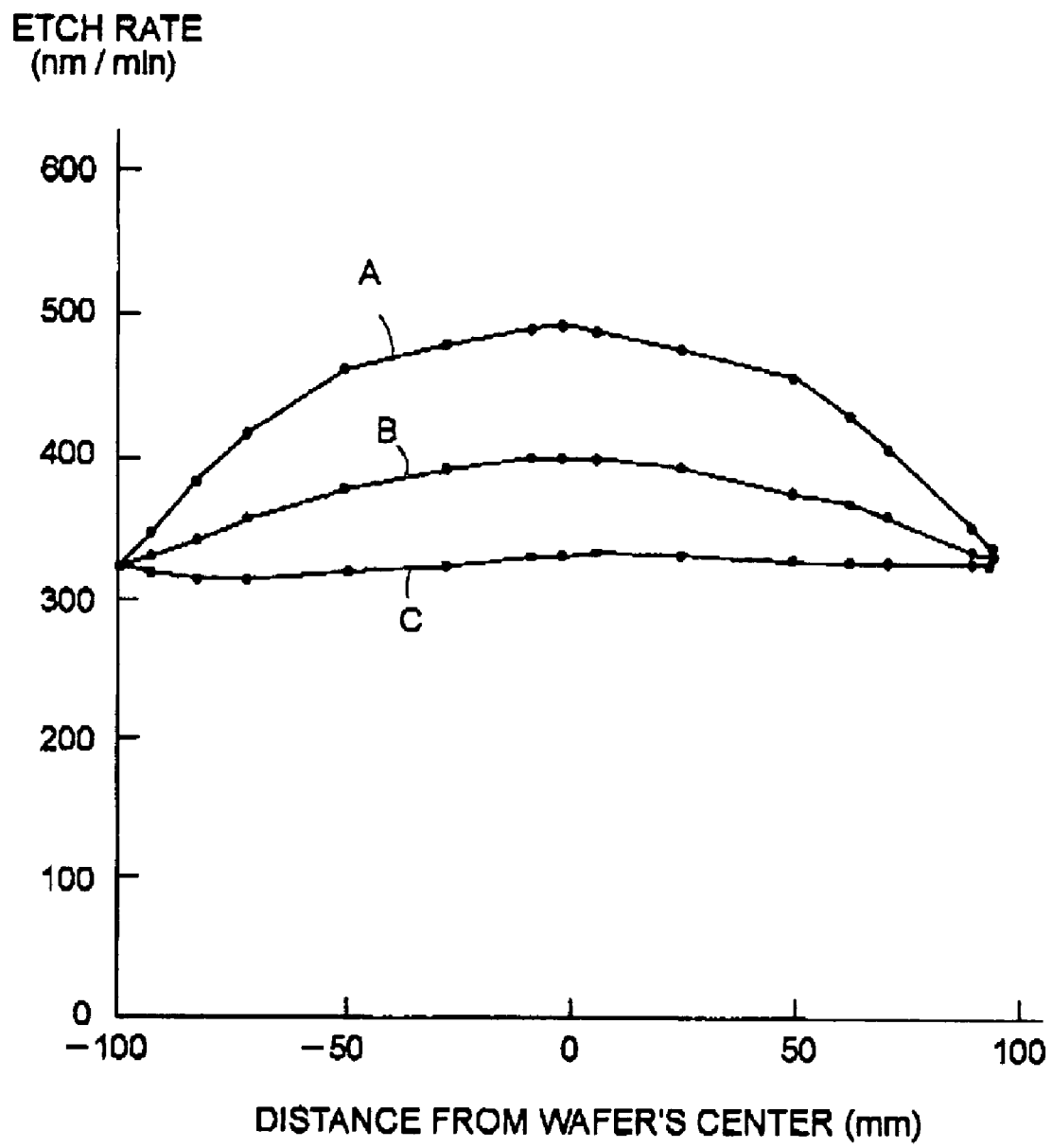
FIG. 7 is a graphic representation for exemplifying etch rate variations across a semiconductor wafer surface using another process gas under different states of the magnetic field, according to the first embodiment of the present invention.
Figure 8:
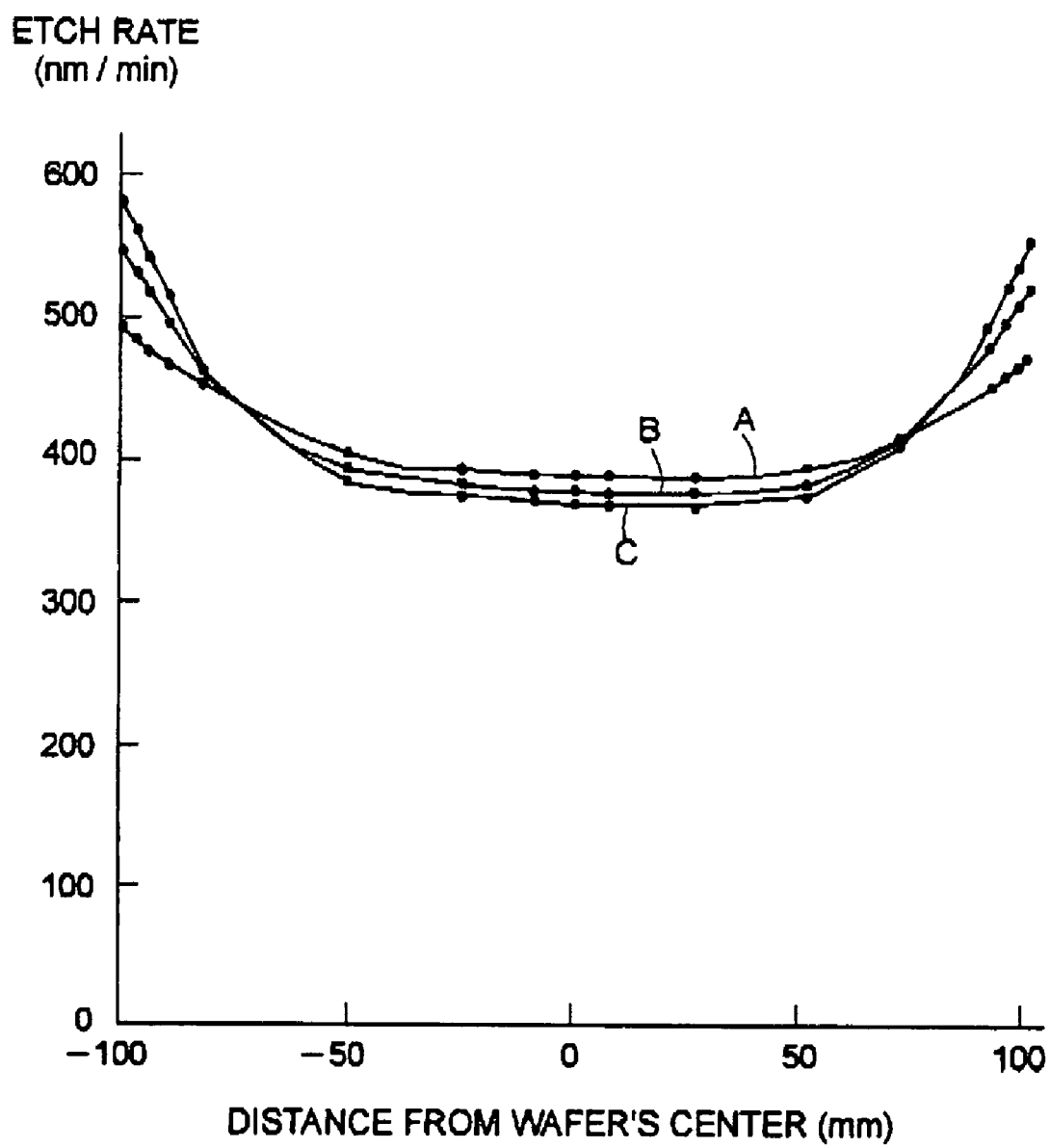
FIG. 8 is a graphic representation for exemplifying etch rate variations across a semiconductor wafer's surface us still another process gas under different states of magnetic field, according to the first embodiment of the present invention.

FIGS. 6 to 8 are graphic representations of experimental results of uniformities of etch rates measured as a function of the distance from the center of the semiconductor wafer W under different conditions. In each of FIGS. 6 to 8, the curve A indicates the results obtained in the absence of magnetic field in the vacuum chamber 1, the curve B indicating the results obtained in the presence of a multi-pole magnetic field of strength 0.03 T (300 G), and the curve C indicating the results obtained in the presence of a multi-pole magnetic field of strength 0.08 T (800 G).

The curve A of FIGS. 6 to 8 indicates the case where the polarity of the magnetic fields that are produced by the magnetic segments (which are adjacent in the radial directions) of the inner and outer magnetic field generating potions 22 and 23 are opposite. In other words, the curve A of FIGS. 6 to 8 indicates the etch rates measured as a function of the distance from the center of the semiconductor wafer W, when the inner and outer magnetic field generating potions 22 and 23 are relatively displaced by the magnetic pole pitch τ from the reference position. This case corresponds to each of the cases shown in FIGS. 3(*c*) and 4(*c*). On the other hand, the curve C of FIGS. 6 to 8 indicates the case where the polarity of the magnetic fields that are generated by the magnetic segments (which are adjacent in the radial directions) of the inner and outer magnetic field generating potions 22 and 23 are identical. In other words, the curve C of FIGS. 6 to 8 indicates the etch rates measured as a function of the distance from the center of the semiconductor wafer W, when the inner and outer magnetic field generating potions 22 and 23 is in the reference position. This case corresponds to each of the cases shown in FIGS. 3(*a*) and 4(*a*). Still further, the curve B of FIGS. 6 to 8 indicates the etch rates measured as a function of the distance from the center of the semiconductor wafer W, when the circumferential relative position of the inner and outer magnetic field generating potions 22 and 23 is between the two cases referred to with the curves A and C. This case corresponds to the case shown in FIG. 3(*b*).

$C_4F_s$ gas was used for etching a silicon dioxide film to obtain the results shown in FIG. 6. $CF_4$ gas was used for etching a silicon dioxide film to obtain the results of FIG. 7, and a mixture of $N_2$ and $H_2$ gases was used for etching an organic low-dielectric film to obtain the results of FIG. 8. As indicated in FIGS. 6 and 7, in the case where the etching gas containing carbon (C) and fluorine (F) is used to etch the silicon dioxide film, it is understood that the etch rate uniformity over the surface of the wafer was able to be improved in the presence of a multi-pole magnetic field in the vacuum chamber 1. Further, as indicated in FIG. 8, when the mixture of $N_2$ and $H_2$ was used to etch the organic low-dielectric film, the etch rate uniformity over the surface of the wafer was able to be improved in the absence of the multi-pole magnetic field.

Therefore, in the embodiment of the present invention, the multi-pole magnetic field can easily be controlled by changing the relative position in the circumferential direction of the inner and outer magnetic field generating portions 22 and 23. In other words, the multi-pole magnetic field in the vacuum chamber can adaptively be controlled.

The number of the magnetic segments is determined depending on the desired distribution of the magnetic field strength, and thus may not be limited to any particular number such as a multiple of 2. Further, the cross section of each magnetic segment may take the form of a square, a polygon or a circle. However, in view of ease of manufacturing, it is preferable that each magnetic segment may take a rectangular cross section. Still further, the magnetic segment 22a and 22b are not limited to specified ones, and may take the form of rare-earth magnets, ferrite magnets, or Alnico magnets, all of which are well known in the art.

Figure 9A:
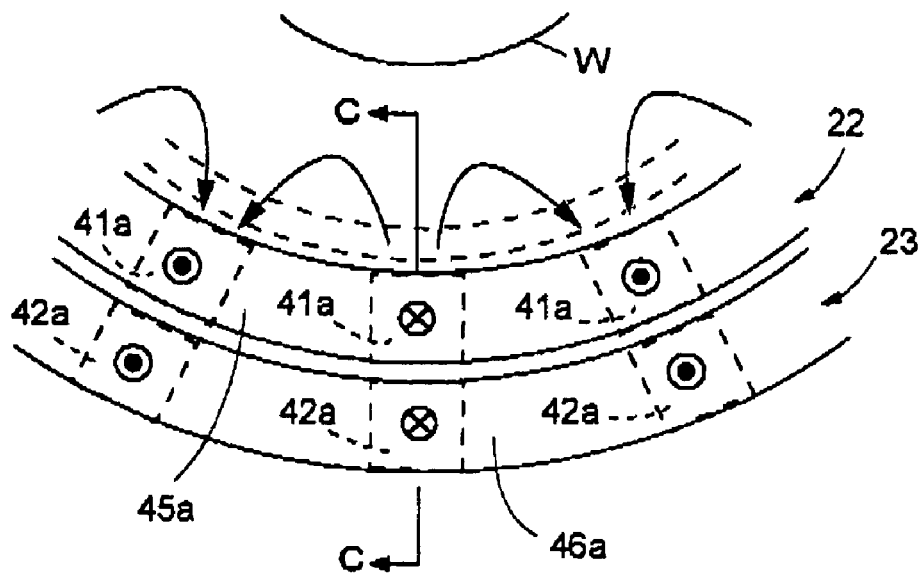
FIGS. 9(a) and 9(b) are diagrams for describing a variant of the second embodiment shown in FIG. 4.
Figure 9B:
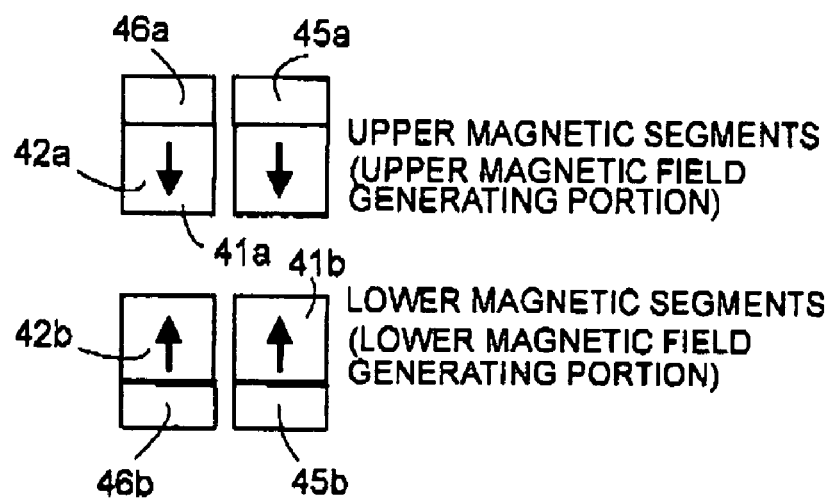

Referring to FIGS. 9(a) and 9(b), a variant of the second embodiment (FIG. 4) of the present invention will be described. FIGS. 9(a) and 9(b) respectively correspond to FIGS. 4(a) and 4(b). As shown in FIGS. 9(a) and 9(b), the instant variant is such that the inner and outer magnetic field generating portions 22 and 23 carry magnetic rings 45a-46a and 45b-46b at the upper and lower surfaces thereof, respectively. Other than this, the variant is substantially identical to the second embodiment of FIG. 4. By providing the magnetic rings 45a-45b and 46a-46b, it is possible to increase the magnetic field strength by approximately 50% compared to the second embodiment of FIG. 4. That is to say, with the variant of FIGS. 9(a) and 9(b), the same magnetic field strength as with the second embodiment is attainable with less amount of magnetic material. The rings 45a-46a and 45b-46b may be made of pure iron, carbon steel, iron-cobalt steel, stainless steel and the like.

The following is a description of the operation of the plasma etching process using the magnetic field generator of the present invention.

Initially, the gate valve 24 is opened to allow a semiconductor wafer to be introduced, via a load lock chamber (not shown) adjacent to the valve 24, by a loading machine (not shown) into the vacuum chamber 1 and placed on the support table 2 which is already lowered to a predetermined position. When a dc voltage is impressed on the electrode 6a of the electrostatic chuck 6, the semiconductor wafer W is secured to the support table 2 under Coulomb's force.

Thereafter, the loading machine is then withdrawn from the vacuum chamber 1, the gate valve 24 being closed, the support table 2 being raised to the higher position as indicated in FIG. 1 and the suction pump of exhaust system 20 being operated to decrease the pressure in the vacuum chamber 1 through the exhaust port 19.

When the pressure in the vacuum chamber 1 is dropped to a preset level, the gas supply system 15 is operated to admit a preselected gas(es) into the vacuum chamber 1 at a rate 100 to 1000 sccm (for example), after which the pressure within the vacuum chamber 1 is maintained at 1.33 to 133 Pa (10 to 1000 Torr), preferably 2.67 to 26.7 Pa (20 to 200 m Torr).

Under this condition, the high frequency power source 10 is operated to supply high frequency power of 100 to 3000 watts at frequency 13.56 MHz to 150 MHz (100 MHz by way of example) to the support table 2. In his case, a high frequency electric field is produced between the shower head (viz., upper electrode) 16 and the support table (viz., lower electrode) 2. As a result, the introduced gas is converted into plasma under the influence of the high frequency field, which plasma acts on the wafer W thereby to cause etching a predetermined portion(s) of the film deposited on the semiconductor wafer W.

As described above, a positional relationship between the inner and outer magnetic field generating portions 22 and 23 is changed, depending on the plasma process to be carried out, so that a multi-pole magnetic field is generated in the vacuum chamber 1 or is not substantially generated therein.

The multi-pole magnetic field generated may cause localized erosions or scraping at the portions of the inner sidewall of the vacuum chamber 1. In order to avoid the localized erosions, the inner and outer magnetic field generating portions 22 and 23 are synchronously revolved about its vertical center axis by the rotary drive mechanisms 25a and 25b so as to move the magnetic poles it the inner sidewall of the vacuum chamber 1.

At the end of the etching process, the high frequency power from the power source 10 is shut off, the support table 2 being lowered, and the semiconductor wafer W being taken out of the vacuum chamber 1 to the outside through the gate valve 24.

Figure 10A:
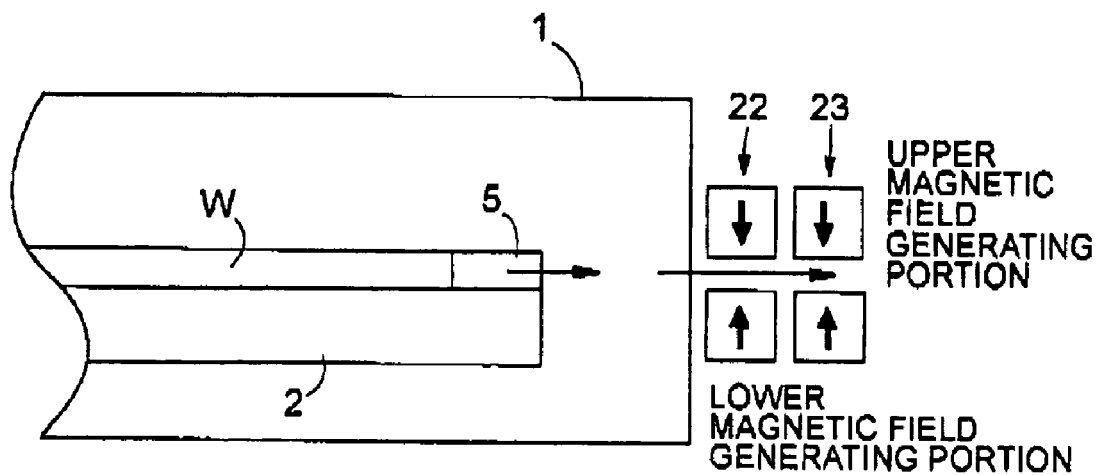
FIGS. 10(a) and 10(b) are diagrams for describing another variant of the second embodiment shown in FIG. 4.
Figure 10B:
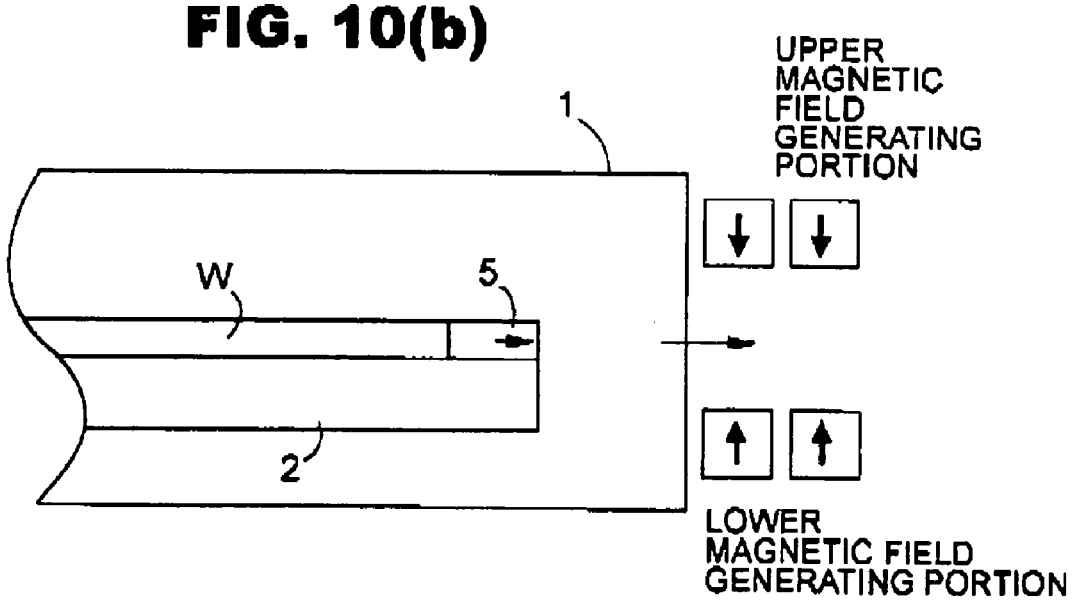

Referring to FIGS. 10(a) and 10(b), there is shown a second variant of the second embodiment (FIGS. 4(a) and 4(b)). The second variant, as with the second embodiment, is provided with the inner and outer magnetic field generating portions 22 and 23, each of which is divided into the upper and lower magnetic field generating portions. However, the second variant in question differs from the second embodiment in that the upper and lower portions are vertically movable with respect to each other. Other than this, the second variant is substantially identical with the second embodiment.

As shown in FIG. 10(a), when the upper and lower magnetic field generating portions are brought close to each other, the magnetic field strength in the vacuum chamber 1 increases as indicated by a long arrow. Contrarily, as shown in FIG. 10(b), when the upper and lower magnetic field generating portions are moved away from each other, the magnetic field strength in the vacuum chamber 1 decreases as indicated by a short arrow. According to the second variant shown in FIGS. 10(a) and 10(b), the multi-pole magnetic field strength in the vacuum chamber 1 can finely be controlled compared to the second embodiment shown in FIG. 4. Therefore, it is possible to reduce the multi-pole magnetic field in the vacuum chamber 1 to substantially zero value without changing the relative position of the inner and outer magnetic field generating portions 22 and 23 up to the magnetic pole pitch τ as in the second embodiment.

In the first embodiment shown in FIG. 3, the magnetic segments 33 of the outer magnetic field generating portion 23 is attached to the inner wall of the magnetic ring 34. However, these magnetic rigs 34 can be omitted.

Figure 11A:
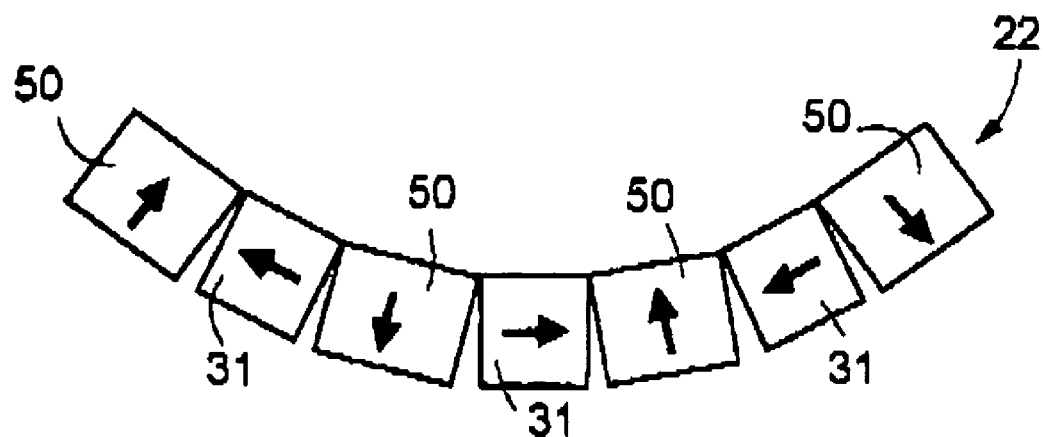
FIGS. 11(a) and 11(b) are diagrams for describing a variant of the first embodiment shown in FIG. 3.
Figure 11B:
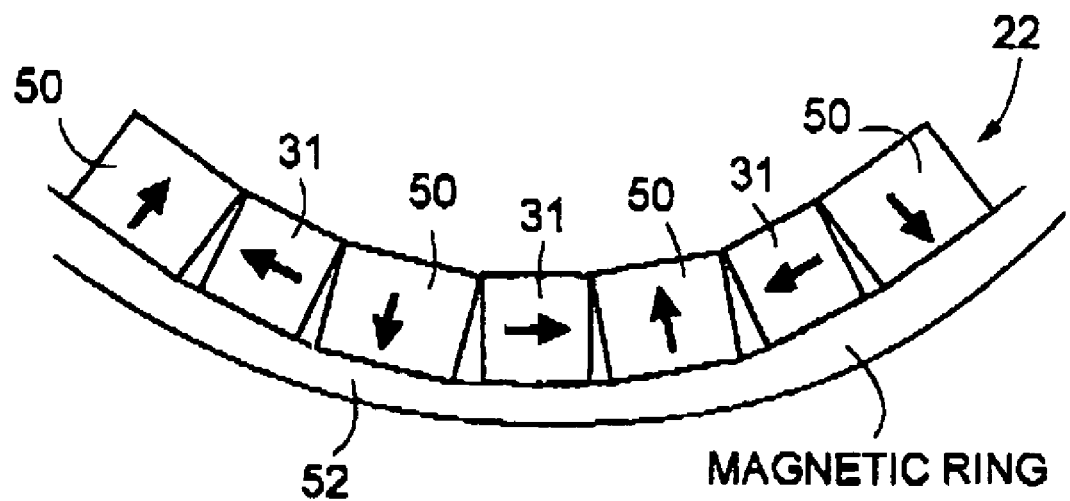

Further, the magnetic pieces 32 of FIG. 3, which are respectively provided between the magnetic segments 31, can be removed and replaced with magnetic segments 50 as shown in FIG. 11(a). Still further, as shown in FIG. 11(b), it is possible to provide a magnetic ring 52 in contact with the outer waits of the magnetic segments 31 and 50. Although not shown in the drawings, the same discussion is applicable to the outer magnetic field generating portion 23.

In FIGS. 9(a) and 9(b), it is possible to modify such as to provide the magnetic rings to the upper and lower surfaces of one of the inner and outer magnetic field generating portions 22 and 23.

In the above description, how to support the magnetic segments of the magnetic field generator 21 is not described in that it is well known in the art.

While mention has been made of embodiments in which the present invention is applied to wafer etching, the present invention could equally be applied to other processes including plasma processing such as CVD film forming process.

The foregoing descriptions show two referred embodiments and some modifications thereof. However, other various modifications are apparent to those skilled in the art without departing from the scope of the present invention which is only limited by the appended claims. Therefore, the embodiments and modification shown and described are only illustrated, not restrictive.

What is claimed is:

1. A plasma processing apparatus, comprising:
a vacuum chamber for accommodating a substrate, said substrate being processed using plasma generated in said vacuum chamber; and
a magnetic field generator, provided outside said vacuum chamber, for generating a multi-pole magnetic field around said substrate for use in plasma confinement,
wherein said magnetic field generator comprises an inner ring-shaped magnetic field generating portion which includes a plurality of segment magnets each of which is circumferentially magnetized with respect to the center of said vacuum chamber, and an outer ring-shaped magnetic field generating portion which includes a plurality of segment magnets each of which is radially magnetized with respect to the center of said vacuum chamber, said inner and outer ring-shaped magnetic field generating portions being independently rotatable with each other.

2. A plasma processing apparatus, comprising:
a vacuum chamber for accommodating a substrate, said substrate being processed using plasma generated in said vacuum chamber; and
a magnetic field generator, provided outside said vacuum chamber, for generating a multi-pole magnetic field around said substrate for use in plasma confinement,
wherein said magnetic field generator comprises inner and outer ring-shaped magnetic field generating portions, each of said inner and outer ring-shaped magnetic field generating portions comprises upper and lower magnetic field generating portions which are vertically provided with spacing there between, and wherein each of said upper and lower magnetic field generating portions comprises a plurality of magnetic segments each being magnetized in a direction in parallel with a center axis of said magnetic field generator, and wherein said magnetic segments of each of said upper and lower magnetic field generating portions face with each other with same magnetic pole, said inner and outer ring-shaped magnetic field generating portions being independently rotatable with each other.

3. The plasma processing apparatus as claimed in claim 2, wherein each of said upper and lower magnetic field generating portions are vertically movable in a manner to be brought close to each other or moved away from each other.

4. The plasma processing apparatus as claimed in claim 2, wherein said magnetic segments of each of said upper and lower magnetic field generating portions are provided circumferentially with a predetermined interval there between and with the magnetic poles thereof being alternately reversed.

5. The plasma processing apparatus as claimed in claim 1, wherein the segment magnets of said inner ring-shaped magnetic field generating portion are magnetized with the magnetic poles thereof being alternated.

6. The plasma processing apparatus as claimed in claim 1, wherein the segment magnets of said outer ring-shaped magnetic field generating portion are magnetized with the magnetic poles thereof being alternated.

* * * * *